United States Patent
Jang et al.

(10) Patent No.: US 7,301,362 B2
(45) Date of Patent: Nov. 27, 2007

(54) DUPLICATED DOUBLE CHECKING PRODUCTION RULE SET FOR FAULT-TOLERANT ELECTRONICS

(75) Inventors: Wonjin Jang, Pasadena, CA (US);
Alain J. Martin, Pasadena, CA (US);
Mika Nystroem, Pasadena, CA (US);
Jonathan A. Dama, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 63 days.

(21) Appl. No.: 11/375,390

(22) Filed: Mar. 14, 2006

(65) Prior Publication Data

US 2007/0016823 A1    Jan. 18, 2007

Related U.S. Application Data

(60) Provisional application No. 60/661,382, filed on Mar. 14, 2005, now abandoned.

(51) Int. Cl.
*H03K 19/003*    (2006.01)

(52) U.S. Cl. .............................. 326/9; 326/10; 326/14; 326/93

(58) Field of Classification Search .............. 326/9–10, 326/14–15, 93–94, 112, 119
See application file for complete search history.

(56) References Cited

U.S. PATENT DOCUMENTS

| | | | |
|---|---|---|---|
| 7,036,059 B1* | 4/2006 | Carmichael et al. | 714/725 |
| 2005/0127971 A1* | 6/2005 | Hoff | 327/217 |

* cited by examiner

*Primary Examiner*—Anh Q. Tran
(74) *Attorney, Agent, or Firm*—Hiscock & Barclay, LLP; Joseph B. Milstein (57) ABSTRACT

Systems and methods for mitigating the effects of soft errors in asynchronous digital circuits. Circuits are constructed using stages comprising doubled logic elements which are connected to c-elements that compare the output states of the double logic elements. The inputs of logic elements in a stage are inhibited from changing until the outputs of the c-elements of that stage are enabled. The c-elements inhibit the propagation of a soft error by halting the operation of the circuit until the temporary effects of the soft error pass.

14 Claims, 11 Drawing Sheets

DUPLICATED DOUBLE CHECKING PRODUCTION RULE SET FOR FAULT-TOLERANT ELECTRONICS

CROSS-REFERENCE TO RELATED APPLICATIONS

This application claims priority to and the benefit of U.S. provisional patent application Ser. No. 60/661,382, filed Mar. 14, 2005, now abandoned which application is incorporated herein by reference in its entirety.

STATEMENT REGARDING FEDERALLY FUNDED RESEARCH OR DEVELOPMENT

The invention described herein was made in the performance of work under a United States Air Force Grant No. F29601-00-K-0184, administered from Kirtland AFB, and is subject to the provisions of Public Law 96-517 (35 U.S.C. §202) in which the Contractor has elected to retain title.

FIELD OF THE INVENTION

The invention relates to improvements in asynchronous circuit technology in general and particularly to systems and methods that employ duplicate circuitry and signal control to eliminate and prevent the propagation of soft errors.

BACKGROUND OF THE INVENTION

Asynchronous circuits operate without a clock. Quasi Delay Insensitive (hereinafter "QDI") circuits are robust to variable operating conditions, but like any other digital circuits they are susceptible to soft errors. As the circuit feature size decreases, soft error rates increase and become a concern both for logic designers and for operation of real circuits in certain inhospitable environments.

QDI circuits are a class of delay-insensitive asynchronous circuit which are invariant to (and make no assumptions about) the delays of any of the circuit's elements, except to assume that certain fanouts are isochronic forks. Isochronic forks allow signals to travel to two (or more) destinations and only receive an acknowledge signal from one. Isochronic forks are forks in circuit elements such as wires. In an isochronic fork, if the acknowledging target has seen a transition on its branch of the fork, then the transition must have also happened on the other branch (or branches) of the fork as well. There are two types of isochronic forks. An asymmetric isochronic fork only ensures that the signal will reach an acknowledging node on one branch before or at the same time that the signal will arrive at the other node on another branch. A symmetric isochronic fork ensures that the signal will arrive at nodes on both branches at the same time. Symmetrical isochronic forks allow either of the targets to acknowledge the signal. In QDI circuits all forks have to be either isochronic and acknowledged by one of the destinations, or acknowledged by all destinations.

Several QDI microprocessors have been designed by compilation of message passing specifications into guarded commands. An example is the Caltech MiniMIPS processor, the first fully QDI processor, which approached commercial MIPS implementations in performance, and worked over a larger range of supply voltages and temperatures.

During demonstrations, the Caltech researchers loaded a simple program which ran in a tight loop, and which pulsed one of the output lines after each instruction. This output line was connected to an oscilloscope. When a cup of hot coffee was placed on the chip, the pulse rate (the effective "clock rate") naturally slowed down to adapt to the worsening performance of the heated transistors. When liquid nitrogen was poured on the chip, the instruction rate increased. Additionally, at lower temperatures, the voltage supplied to the chip could be safely increased, which also improved the instruction rate.

In 2004, Epson manufactured the first flexible microprocessor, an 8-bit asynchronous chip. Synchronous flexible processors cannot be built, since bending the material on which a chip is fabricated causes unpredictable variations in the delays of various transistors, violating the timing assumptions inherent in synchronous design. The Epson processor is intended for use in smart cards, whose chips are currently limited in size to those small enough to remain undistorted.

Some of the benefits provided by QDI circuits include: robust handling of metastability of arbiters; lower power consumption due to the fact that no transistor performs transitions unless it is performing useful computation; elimination of distribution of a high-fanout, timing-sensitive clock signal; elimination of assumptions about the manufacturing process that affect timing; circuit speed that responds to changing temperature and voltage conditions rather than being limited to the slowest speed mandated by worst-case assumptions; immunity to transistor-to-transistor variability in the manufacturing process; and reduction in electromagnetic interference (or EMI) caused by clocking circuits.

Prior art error correction methods applied in synchronous circuits include triple modular redundancy with voters. When a soft error occurs, a conventional QDI system may perform incorrectly or halt. There is a need for systems and methods to mitigate the effects of soft errors on circuits of various kinds, including asynchronous circuits.

SUMMARY OF THE INVENTION

In one aspect, the invention relates to a method of mitigating soft errors in an asynchronous digital circuit having a stage comprising duplicate asynchronous circuit elements. Each of the duplicate asynchronous digital circuit elements has at least one input terminal and at least one output terminal. Each of the duplicate asynchronous digital circuit elements provides the same logic operation. The method comprises the steps of asserting a digital signal at corresponding ones of each of the at least one input terminals of the duplicate asynchronous digital circuit elements; inhibiting a variation of the asserted digital signal asserted at corresponding ones of each of the at least one input terminals of the duplicate asynchronous digital circuit elements; and comparing an output signal appearing at the at least one output terminal of one of the duplicate asynchronous digital circuit elements with a corresponding output signal appearing at the at least one output terminal of the other of the duplicate asynchronous digital circuit elements. Based on the result of the comparison of the output signals, if the output signals are not deemed equivalent, the process involves inhibiting a resultant signal from being provided as output from the stage; maintaining the step of inhibiting a variation of the asserted digital signal asserted at corresponding ones of each of the at least one input terminals of the duplicate asynchronous digital circuit elements; continuing to compare an output signal appearing at the at least one output terminal of one of the duplicate asynchronous digital circuit elements with a corresponding output signal appearing at the at least one output terminal of the other of the duplicate asynchronous digital circuit elements; and continuing the preceding three steps until the output signals are deemed equivalent. If the output signals are deemed equivalent, the method involves performing the steps of providing at least one resultant signal as output from the stage; and permitting a variation of the asserted digital signal asserted at corresponding ones of each of the at least one input terminals of the duplicate asynchronous digital circuit elements. By this process, the stage comprising duplicate asynchronous digital circuit elements is active in the absence of soft errors and is prevented from being active during the presence of soft errors, thereby eliminating soft errors from propagating in the asynchronous digital circuit.

In one embodiment, the method employs three or more stages comprising duplicate asynchronous circuit elements. In one embodiment, the step of comparing an output signal appearing at the at least one output terminal of one of the duplicate asynchronous digital circuit elements with a corresponding output signal appearing at the at least one output terminal of the other of the duplicate asynchronous digital circuit elements is performed by a c-element. In one embodiment, the step of inhibiting a variation of the asserted digital signal asserted at corresponding ones of each of the at least one input terminals of the duplicate asynchronous digital circuit elements is performed by a c-element. In one embodiment, the step of inhibiting a resultant signal from being provided as output from the stage is performed by a c-element. In one embodiment, the method corrects a plurality of soft errors using a weak c-element.

In another aspect, the invention features an asynchronous digital circuit configured to mitigate soft error propagation. The circuit comprises a stage comprising duplicate asynchronous circuit elements. Each of the duplicate asynchronous digital circuit elements has at least one input terminal and at least one output terminal. Each of the duplicate asynchronous digital circuit elements provides the same logic operation. The circuit additionally comprises a first comparison element having two input terminals and a first output, a selected one of the two input terminals connected to each of the at least one output terminal of each of the duplicate asynchronous digital circuit elements, and a second comparison element having two input terminals and a second output, a selected one of the two input terminals connected to each of the at least one output terminal of each of the duplicate asynchronous digital circuit elements; and a control element in electrical communication with the first output of the first comparison element and the second output of the second comparison element, the control element configured to provide control signals based on the equivalence or lack of equivalence of signals appearing at the first output of the first comparison element and the second output of the second comparison element. In the event that the signals appearing at the first and second outputs are not equivalent, the control element provides a control signal to inhibit a resultant signal from appearing as output at an output terminal of the stage; and the control element provides a control signal to inhibit a variation of the asserted digital signal asserted at corresponding ones of each of the at least one input terminals of the duplicate asynchronous digital circuit elements. In the event that the signals appearing at the first and second outputs are equivalent, the control element provides a control signal to allow at least one resultant signal as output at the output terminal the stage; and the control element provides a control signal to permit a variation of the asserted digital signal asserted at corresponding ones of each of the at least one input terminals of the duplicate asynchronous digital circuit elements. The stage comprising duplicate asynchronous digital circuit elements is active to provide a signal representing the logic operation in the absence of soft errors and is prevented from being active during the presence of soft errors, thereby eliminating soft errors from propagating in the asynchronous digital circuit.

In one embodiment, the asynchronous digital circuit comprises three or more stages comprising duplicate asynchronous circuit elements. In one embodiment, the first comparison element is a c-element. In one embodiment, the control element is combined with the comparison element. In one embodiment, the circuit is a field programmable gate array. In one embodiment, the circuit comprises dual interlocked programmable bits. In one embodiment, the circuit comprises a pre-charged half buffer. In one embodiment, the circuit comprises a weak c-element.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 1$a$ illustrates a prior art AND gate in a conventional asynchronous digital circuit;

FIG. 1$b$ illustrates a duplicated double-checking (hereinafter "DD") embodiment of the AND gate of FIG. 1$a$, according to principles of the invention;

FIG. 2$a$ is a diagram showing an illustrative prior art gate-level implementation of a C-element;

FIG. 2$b$ is a diagram showing an illustrative prior art transistor-level implementation of a C-element;

FIG. 2$c$ is a diagram showing a circuit symbol for the C-element;

FIG. 3$a$ shows an illustrative prior art gate-level implementation of an asymmetric C-element;

FIG. 3$b$ shows an illustrative prior art transistor-level implementation of an asymmetric C-element;

FIG. 3$c$ is a diagram showing a circuit symbol for the asymmetric C-element;

FIG. 10$a$ is a diagram showing an embodiment of a circuit that implements generally programmable SRAM bits in FPGA employing two conventional cross-coupled inverters comprising 6 transistors, according to principles of the invention;

DETAILED DESCRIPTION OF THE INVENTION

The invention is useful for mitigating soft errors in asynchronous digital circuits. Soft error as used herein is intended to denote an error that are transient in nature, such as errors that are caused by the temporary presence of a circuit in a vehicle or other structure that passes close to or through regions having high fluxes of energetic particles, for example as may be encountered in extraterrestrial environments such as the Van Allen radiation belts that exist above portions of the planet Earth. To the extent that environments having high flux densities of energetic particles exist on Earth, for example in the vicinity of nuclear reactors, or synchrotrons, circuits that are temporarily exposed to such environments can also benefit from the application of the principles of the present invention.

For the purposes of the invention, we will consider a circuit to have at least one circuit stage, with the understanding that a circuit stage is a circuit element that performs a basic function, such as a logic function (for example, inversion applied to a single value, or AND, OR, NAND, NOR, or XOR applied to a plurality of values) or a basic mathematical function (for example, summing or multiplying two values). Circuit elements that provide more complex functions can be constructed from assemblages of circuit stages, according to well known rules of logic or according to a defined computational requirement. The circuit elements can be programmable.

In the present invention, the circuit is provided with input information, such as input data, which can be viewed as a "forcing function" that is applied to a circuit stage so that a specific logical or mathematical computation is performed on the input data, and an output result is obtained. The output of one circuit stage can be the input for a successive circuit stage. In the absence of soft errors, a circuit stage is expected to provide a correct answer, i.e., the circuit represents an embodiment of a transfer function, and the output of the transfer function is defined when the input is specified, for example by a relationship such as H(s)=Output(s)/Input(s) in the frequency domain, which can be converted by well known methods to inputs and outputs in the time domain as needed.

In the presence of transient soft errors, for example, errors caused by the generation of electron-hole pairs in a semiconductor material exposed to a high density of highly energetic particles, the data represented by the input information may be temporarily corrupted, or the manipulation of the data may be temporarily disrupted. If no method of mitigating the effects of such soft errors were to be provided, the erroneous output of one circuit stage will be propagated to the input of a successive circuit stage (or the output of the circuit if the circuit stage is a final stage of the circuit), and incorrect results will flow therefrom. It is expected that the soft errors will cease at such time that the high energy flux ceases or is removed, and that the generated electrons and holes will recombine, or flow out of the region of the semiconductor comprising the circuit element. The impressed digital data or information will once again dominate, and the presence of an uncontaminated input value of the circuit stage will result in a correct output value. Equally, when the data manipulation returns to its intended process in the absence of the erroneous component caused by the soft error, the correct output value will be obtained. The present invention provides systems and methods for eliminating the deleterious effects of the soft errors during the time that they are present.

In the present description, we use terminology such as "two outputs are deemed to be equivalent." As is understood in the commonly used digital signal processing arts, two digital values such as "0" and "1," "high" and "low," "on" and "off" or "true" and "false" are used to represent two states in binary signal systems. In general, the voltages that represent either state are understood to fall within defined ranges (for example, to within tenths of volts for systems operating at 3.3 volts or 5 volts) rather than as discrete values. As used herein with regard to digital circuits, two signals will be considered to be equivalent of they both represent the same state as defined by the convention specified for the circuit type or by the accepted range for a specified voltage of operation. The equivalence of two digital signals does not require that their voltages be identical, but merely that they both are recognized to represent the same state (for example, both signals represent valid "1"s or both signals represent valid "0"s). In a similar fashion, for analog signals, as used herein, recognizing that two nominally identical analog circuits will exhibit small differences, two signals can be considered equivalents if they fall within a defined range as compared to one another. For example, in an analog system with a 15 volt dynamic range, two signals could be considered to be equivalent if they fall within a defined range, such as 0.1 volt, for example after being filtered to remove noise or undesired frequency components.

In asynchronous digital circuits, the invention uses two principles to provide a solution to the soft error problem. One principle is that the input signals to a circuit stage remain stable because they are inhibited from changing until a correct output is known to exist. The determination that a correct output value exists is accomplished by providing duplicate circuitry in which duplicate input signals are provided to the input or inputs for each of the duplicate circuit stages and the outputs of the duplicate circuit stages are checked against each other. A feedback loop controls the duplicate inputs to inhibit changes in the asserted or impressed input signals until an acceptable output is obtained, e.g., the outputs of the duplicate circuit stages agree. The second principle is that no output signal from the circuit stage is provided to a subsequent stage (or as circuit output) until the output is determined to be correct, thereby eliminating any erroneous output from being propagated through a circuit.

Duplicated Double-Checking Logic Cell

Redundancy is one way to detect or correct errors in a system. In QDI circuits, dual copies are enough to restore corrupt data due to the stability property of QDI circuits. The stability property is a system property that can be expressed as follows: if the assignment of output of a gate starts, inputs of the gate hold their present values until the assignment is completed.

A duplicated double-checking (DD) circuit is created by duplicating all gates in the original circuit and double-checking all output nodes. Double-checking duplicated output nodes $z_a$, $z_b$ means that we replace $z_a$, $z_b$ with new nodes (e.g., $z'_a$, $z'_b$) and introduce two C-elements that share the inputs $z'_a$, $z'_b$ and whose outputs are $z_a$ and $z_b$. FIG. 1b shows an example of a DD gate. DD circuits can tolerate multiple soft errors unless two or more errors occur in two adjacent DD gates.

The soft-error-tolerance of DD circuits is based on the fact that at least one duplicated variable of each pair in DD circuits will contain a correct value, and the double-checking scheme prevents corrupted values from propagating to subsequent gates. That is, an error is confined between double-checking C-elements, and the correct data can be reconstructed due to the stability property. Although soft errors can delay computations of the system, the correctness of computations is still guaranteed. The DD scheme is a sufficient construction to get soft-error tolerance, and for optimization, some of the double-checking C-elements in DD circuits can be omitted without eliminating soft-error tolerance.

Figure 1A:
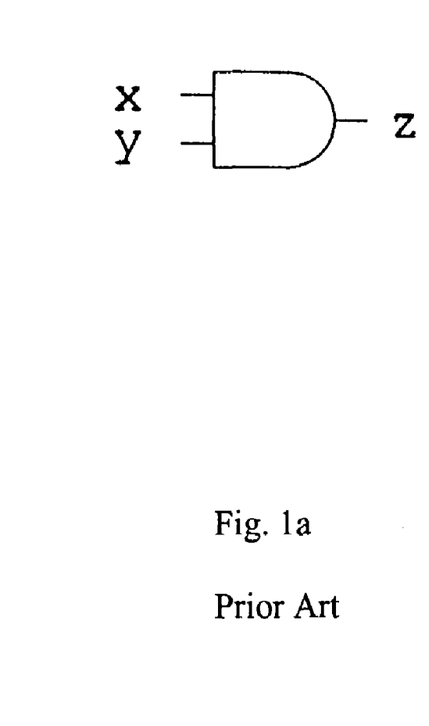
Figure 1B:
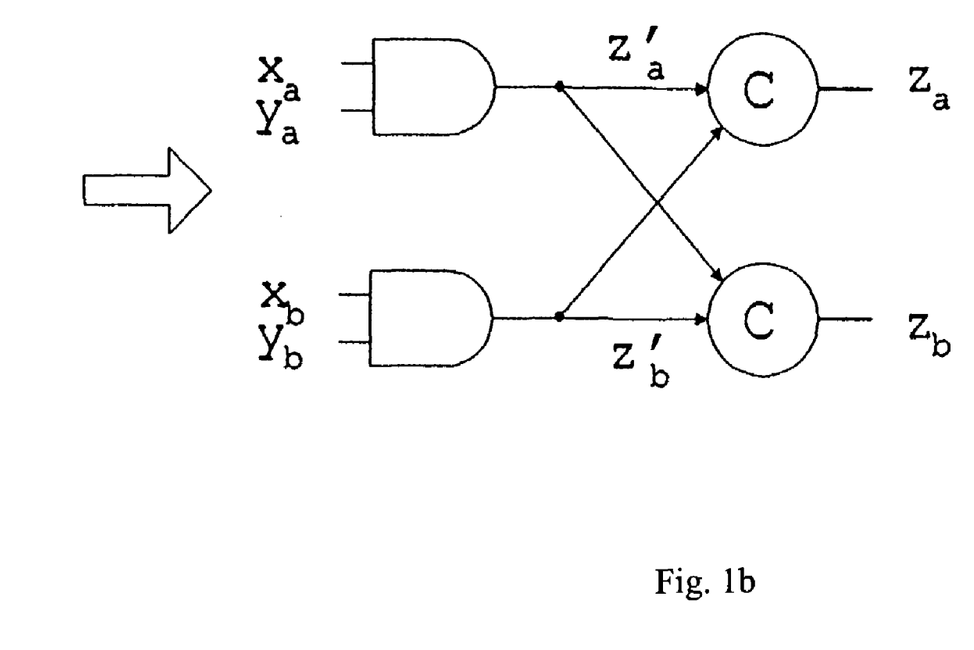

FIG. 1a illustrates a prior art AND gate in a conventional asynchronous digital circuit. The AND gate has two inputs, designated x and y, and an output designated z, which may drive more than one subsequent circuit element. Therefore, the output is shown having three branches.

FIG. 1b illustrates a duplicated double-checking (hereinafter "DD") embodiment of the AND gate of FIG. 1a. The DD embodiment comprises two AND gates, the outputs of which are connected to two C-elements which are discussed in more detail below.

In the circuit of FIG. 1b, the upper AND gate has inputs $x_a$ and $y_a$ and intermediate output $z'_a$ and the lower AND gate has inputs $x_b$ and $y_b$ and intermediate output $z'_b$. The upper C-element receives the two intermediate outputs as input, and provides output $z_a$. The lower C-element receives the two intermediate outputs as input, and provides output $z_b$. First consider operation in the absence of soft errors. As an initial state, suppose that the intermediate outputs $z'_a$ and $z'_b$, and the outputs $z_a$ and $z_b$ are "0" and inputs $x_a$ and $y_a$ are about to be set to "1." Because of the symmetrical construction, we know that $x_b$ and $y_b$ are also about to set to "1." Then the intermediate outputs $z'_a$ and $z'_b$ are assigned to be "1" and eventually the outputs $z_a$ and $z_b$ will be "1." There will be a time when the outputs assume a state ($z'_a$, $z'_b$, $z_a$, $z_b$)=(1,1,0,0), that is, the intermediate outputs have switched, but the outputs $z_a$ and $z_b$ have not yet switched state.

Now let us assume that a soft error occurs on intermediate output $z'_a$ at the moment when the state ($z'_a$, $z'_b$, $z_a$, $z_b$)=(1,1,0,0) exists. The state becomes (0,1,0,0) due to the error. The C-elements, which assign outputs only if both inputs are identical, cannot update the final outputs $z_a$ and $z_b$, so that the subsequent stages cannot see any change from this gate set, and the inputs of the ANDs do not vary. In QDI circuits the inputs of gates are updated only after the outputs are acknowledged by the environment (which is also known as stability of a system). The inputs still hold the correct values, and they eventually restore the corrupt intermediate output to be "1", restoring the correct state (1,1,0,0). After the restoration, the computation can continue. The stalling of the computation until the restoration occurs does not matter in the asynchronous system.

C-Elements

The C-element was invented by Dr. David E. Muller (Ph.D. Physics, Caltech, 1951). The C-element is well known in the asynchronous logic art, comprising circuitry that compares the output signals from the two AND gates and comprising circuitry that prohibits an incorrect result from propagating to subsequent stages. The C-element applies logical operations to the signals appearing at its inputs and has hysteresis. The output of the C-element reflects the inputs when the states of all inputs match. The output then remains in this state until the inputs all transition to the other state. If the inputs do not all match, the C-element leaves its output unchanged so that no new signal is propagated to the next circuit stage.

Figure 2A:
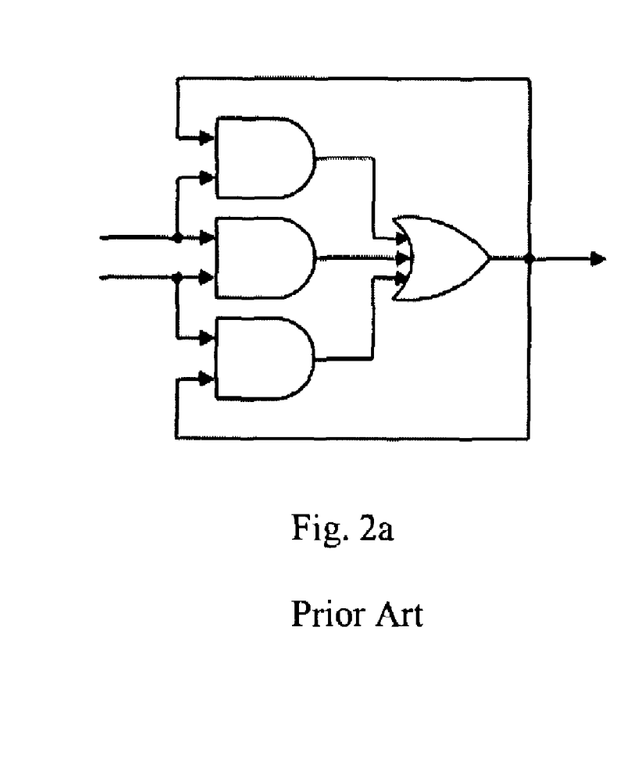
Figure 2B:
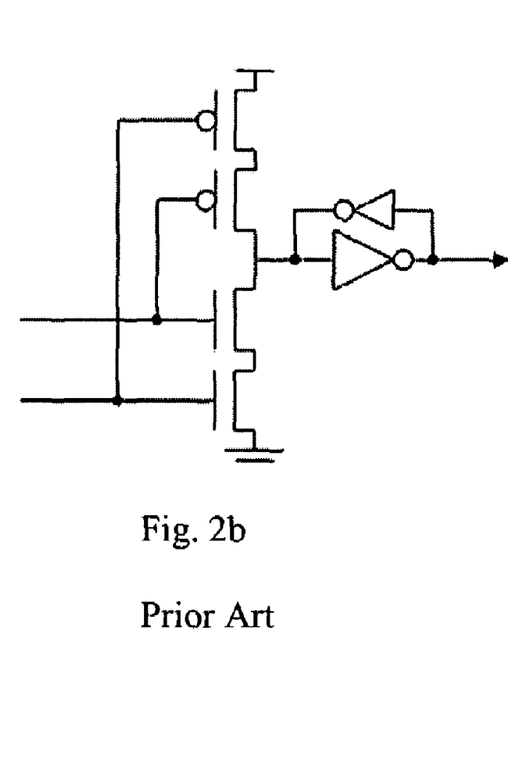
Figure 2C:
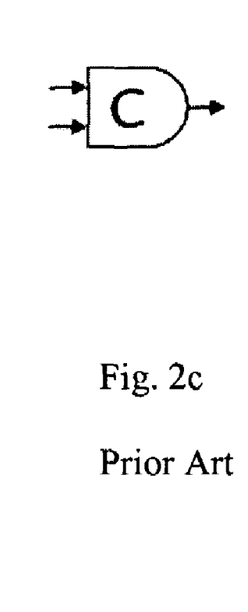

FIG. 2a is a diagram showing an illustrative prior art gate-level implementation of a C-element. FIG. 2b is a diagram showing an illustrative prior art transistor-level implementation of a C-element. FIG. 2c is a diagram showing a circuit symbol for the C-element. As indicated, more complex logic circuits can be constructed using known rules such as are described using truth tables, and known circuit elements. For example, a circuit that implements the logic function A AND (NOT B) could in one embodiment be constructed by inserting an inverter into the circuit before the B input of an AND gate to generate a NOT B signal, which is then applied as an input to the AND gate. The AND gate is well known to provide an output of "true" if and only if both inputs are simultaneously "true," however the state "true" is implemented. Thus, a "true" value results for the A AND (NOT B) gate if and only if A is true and B is false.

Figure 3A:
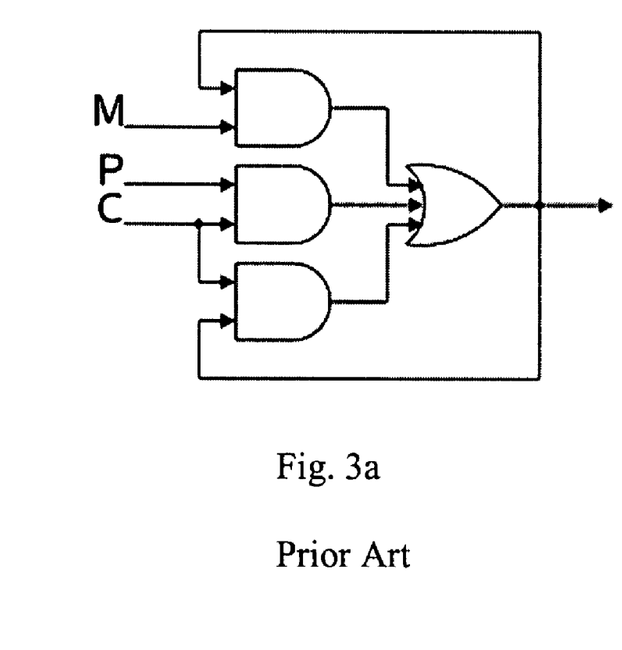
Figure 3B:
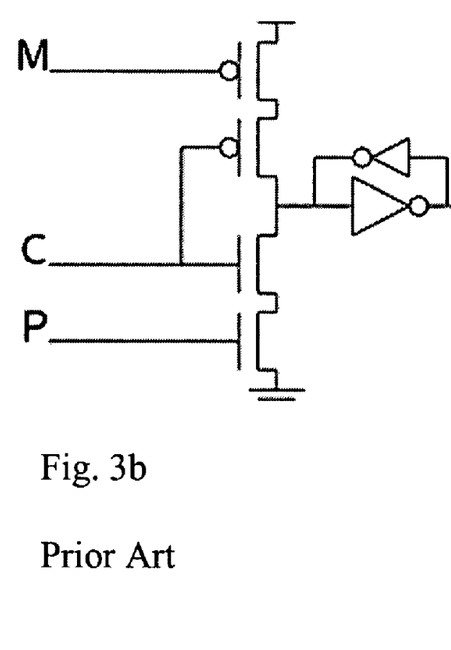
Figure 3C:
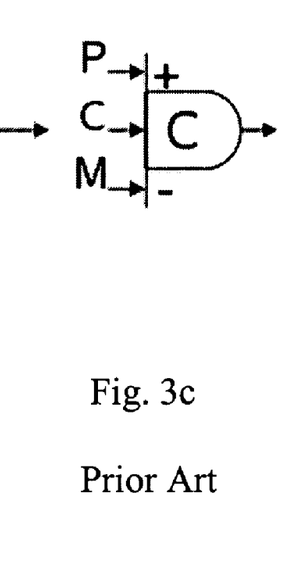

C-elements can be generalized to asymmetric C-elements which allow inputs which only effect the operation of the element when transitioning in one of the directions. Asymmetric inputs are attached to either the minus (−) or plus (+) input terminals of the asymmetric C-element. The common inputs which effect both the transitions are connected to the common input terminal. When transitioning from zero to one the C-element will take into account the common and the asymmetric plus inputs. All these inputs must be high for the up transition to take place. Similarly when transitioning from one to zero the C-element will take into account the common and the asymmetric minus inputs. All these inputs must be low for the down transition to occur. FIG. 3a shows an illustrative prior art gate-level implementation. FIG. 3b shows an illustrative prior art transistor-level implementation. FIG. 3c is diagram showing a circuit symbol for the asymmetric C-element. In FIGS. 3a, 3b, and 3c the plus input terminals are marked with a 'P', the minus input terminals are marked with an 'M' and the common input terminals are marked with a 'C'.

QDI Circuit Representation

QDI circuits are typically modeled using the Production-Rule Set (PRS) notation. Under the PRS model, a soft error is modeled as changing the value of a single boolean variable in the PRS describing the circuit (also referred to as "bit-flipping").

A Production Rule (PR) has the form G→S, where G is a boolean expression called the guard of the PR, and S is a simple assignment, i.e., z↑ or z↓, meaning z:=true or z:=false. An execution of a PR G→S is an unbounded sequence of firings. A firing of G→S with G true amounts to the execution of S, and a firing with G false amounts to a skip. If the firing of a PR changes the value of any variable, the firing is called effective. If we say that a PR fires, it means that the firing is effective.

A PR G→S is said to be stable if whenever G becomes true it remains true until the assignment S is completed. Two PRs G1→z↑ and G2→z↓ are non-interfering if and only if ¬G1 OR ¬G2 (that is, NOT G1 OR NOT G2) always holds. Stability and non-interference guarantees that the execution of a PR set is hazard-free. The two complementary PRs that set and reset the same variable, such as G1→z↑ and G2→z↓ form a gate. The variables in the guards are inputs of the gate and the variable in the assignment is the output of the gate. A PR G→z↑ is said to be self-invalidating when z=>¬G. Likewise G→z↓ is self-invalidating when ¬z=>G. Non-self-invalidating of PRs is necessary to implement a PRS in CMOS technology because the assignment of nodes is not instantaneous in the physical implementation. In the remainder of this analysis, we will consider stable, non-interfering, and self-invalidating-free PRS.

Duplicated Double-Checking PRS

A duplicated double-checking PRS (DDPRS) is produced by duplicating all PRs in the original PRS and double-check all output variables. Double-checking duplicated output variables $z_a$, $z_b$ means that we replace $z_a$, $z_b$ with new variables (e.g., $z'_a$, $z'_b$) and introduce two C-elements that share the inputs $z'_a$, $z'_b$, called checked-in (CI) variables, and whose outputs are $z_a$ and $z_b$, called checked-out (CO) variables. Two variables (e.g., $x_a$, $x_b$ shown below) that encode the same bit are called duplicated variables. The PRS of a gate are:

Gp( . . . , x, . . . )→z↑
Gn( . . . , x, . . . )→z↓, and the PRS of the corresponding DD gate are:

$G^a_p$( . . . , $x_a$, . . . )→$z'_a$↑
$G^b_p$( . . . , $x_b$, . . . )→$z'_b$↑
$G^a_n$( . . . , $x_a$, . . . )→$z'_a$↓
$G^b_n$( . . . , $x_b$, . . . )→$z'_b$↓
$z'_a$ˆ$z'_b$→$z_a$↑, $z_a$↑, $z_b$↑ (where ˆ represents AND)
¬$z'_a$ˆ¬$z'_b$→$z_a$↓, $z_b$↓.

FIG. 1b previously discussed illustrates an example of a DD gate based on an AND logic gate.

Figure 4:
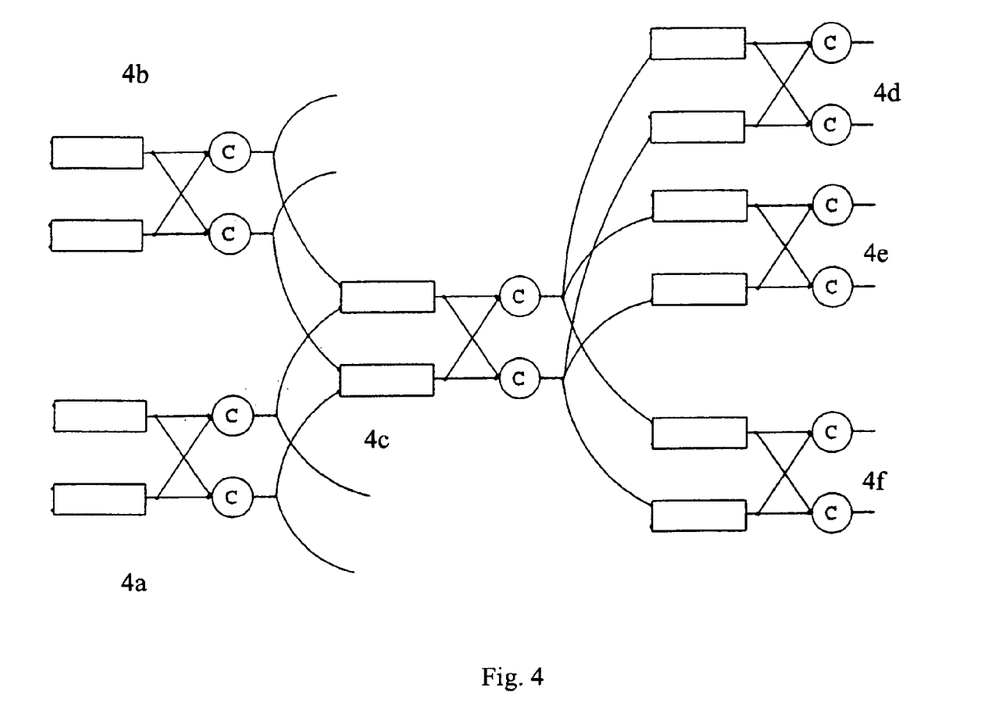
FIG. 4 is a diagram illustrating an embodiment of a DDPRS circuit having a plurality of circuit stages, according to principles of the invention.

If the original PRS is stable and non-interfering, then the DDPRS is also stable and non-interfering. Moreover, the DDPRS has an additional property on its CI variables, called pseudo doubled-up stability. That is, assignments of output CI variables $z'_a$, $z'_b$ can fire only after both input CI variables $x'_a$, $x'_b$ have the same value, and $x'_a$, $x'_b$ are reset only after the assignments of $z'_a$, $z'_b$ are completed. Though DDPRS seems to be much weaker than the more aggressive doubled-up scheme where every literal in guards of duplicated gates is also duplicated, the pseudo doubled-up stability makes DDPRS quite robust under a soft error. FIG. 4 is a diagram illustrating an embodiment of a DDPRS circuit having six circuit stages 4a, 4b, 4c, 4d, 4e, and 4f in a configuration in which stages 4a and 4b provide their outputs as inputs for stage 4c, which in turn provides its outputs as inputs for stages 4d, 4e, and 4f.

We can prove the following theorem that indicates that in general, a circuit having at least three DD gates will be useful even when soft errors are being generated. The DDPRS circuit of FIG. 4 is such a circuit.

Theorem: If there are at least three DD gates in each feedback cycle of gates, then a DDPRS is free from deadlock and abnormal computations caused by a soft error.
Proof: The part of the DDPRS is as follows:

. . .
$G^a_p$( . . . , $x_a$, . . . )→$z'_a$↑
$G^b_p$( . . . , $x_b$, . . . )→$z'_b$↑
$G^a_n$( . . . , $x_a$, . . . )→$z'_a$↓
$G^b_n$( . . . , $x_b$, . . . )→$z'_b$↓
$z'_a$ˆ$z'_b$→$z_a$↑, $z_b$↓ (where the symbol ˆ represents AND)
¬$z'_a$ˆ¬$z'_b$→$z_a$↓, $z_b$↓.
$g^a_p$( . . . , $z_a$, . . . )→$w'_a$↑
$g^b_p$( . . . , $z_b$, . . . )→$w'_b$↑
$g^a_n$( . . . , $z_a$, . . . )→$w'_a$↓
$g^b_n$( . . . , $z_b$, . . . )→$w'_b$↓

$w'_a$ˆ$w'_b$→$w_a$↑, $wz_b$↑
¬$w'_a$ˆ¬$w'_b$→$w_a$↓, $wz_b$↓.
. . .

The soft-error-tolerance of DDPRS is based on the fact that at least one duplicated variable of each pair in DDPRS will contain a correct value, and that the double-checking scheme prevents corrupted values from propagating to subsequent gates. We will examine the event scenario. Because of the symmetrical construction, without loss of generality, it is sufficient to consider the effects for soft errors occurring only at $z_a$ and $z'_a$.

First, let us assume that a soft error at a CI variable $z'_a$ occurs during the state s=( . . . $z'_a z'_b$ . . . )=( . . . 10 . . . ) that comes from a state q=( . . . $z'_a z'_b$ . . . )=( . . . 00 . . . ) where $G^a_p$ holds, and s becomes $s_{error}$ due to the soft error. No new PRs are enabled by $z'_a z'_b$=10 in s, and values of all variables except $z'_a$ in s remain the same as in q. The soft error merely causes s to go back to q and the redundant firing of $z'_a$↑ is not discernable in the environment.

Second, a soft error at $z'_a$ occurs in s=( . . . 01 . . . ) from q where $G^b_p$ holds. The soft error is equivalent to $z'_a$↑, and the symmetrical construction of DDPRS guarantees that if $G^b_p$→$z'_b$↑ is fired, $z'_a$↑ will fire eventually. While CI variables are assigned correctly, assignments of CO variables such as $x_a$ in $G^a_p$ may not be completed. However the incomplete assignment is confined in the DD gate. After the environment resets the CI variables $x'_a$ and $x'_b$, the CO variables $x_a$, $x_b$ will be also reset to normal values. A soft error in the similar states such as ( . . . 10 . . . ) and ( . . . 01 . . . ) that come from ( . . . 11 . . . ) can be analyzed in the same manner.

Third, consider a soft error at $z'_a$ that occurs during the state s=( . . . $z'_a z'_b$ . . . )=( . . . 00 . . . ). Only the following PRs in DDPRS can be affected by the change of $z'_a$, and other PRs can fire regardless of the change.

$z'_a$ˆ$z'_b$→$z_a$↑; $z_b$↑
¬$z'_a$ˆ¬$z'_b$→$z_a$↓; $z_b$↓

If $G^a_n$→$z'_a$↓ fires, the variable $z'_a$ will be restored to a normal value. Or if $G^b_p$→$z'_b$↑ fires, $z'_a$↑ is supposed to fire due to the symmetrical construction of DDPRS, and $s_{error}$ will become a normal state ( . . . 11 . . . ). The same argument holds in the case of a soft error in the state s=( . . . 11 . . . ).

Fourth, consider a soft error that occurs at a CO variable $z_a$ during a state s=( . . . $z_a z_b$ . . . )=( . . . 10 . . . ) that comes from a state q=( . . . $z_a z_b$ . . . )=( . . . 00 . . . ) where $z'_a$ˆ$z'_b$→$z_a$↑, $z_b$↑ is effective. An assignment of CI variables such as $w'_a$ in a gate can be updated in s, but the change cannot propagate beyond this gate due to the double-checking of $w'_a$ and $w'_b$. Even though the soft error occurs, it will not affect gates beyond $w_a$ and $w_b$, and input variables such as $x_a$ and $x_b$ remain the same as in s. So $z'_a$ˆ$z'_b$ still holds, and $z_a$↑ will fire again to turn $s_{error}$ into s. The soft error merely causes $z_a$↑ to fire one more time than usual. There is another case that a soft error at $z_a$ occurs in s=( . . . 01 . . . ) reached by the firing of $z_b$↑ first from the state q. The soft error is equivalent to $z_a$↑, which is supposed to happen because $z'_a$ˆ$z'_b$→$z_a$↑ is effective in s. A soft error at $z_a$ in the similar states such as ( . . . 10 . . . ) and ( . . . 01 . . . ) that come from ( . . . 11 . . . ) can be analyzed in the same manner.

Figure 5:
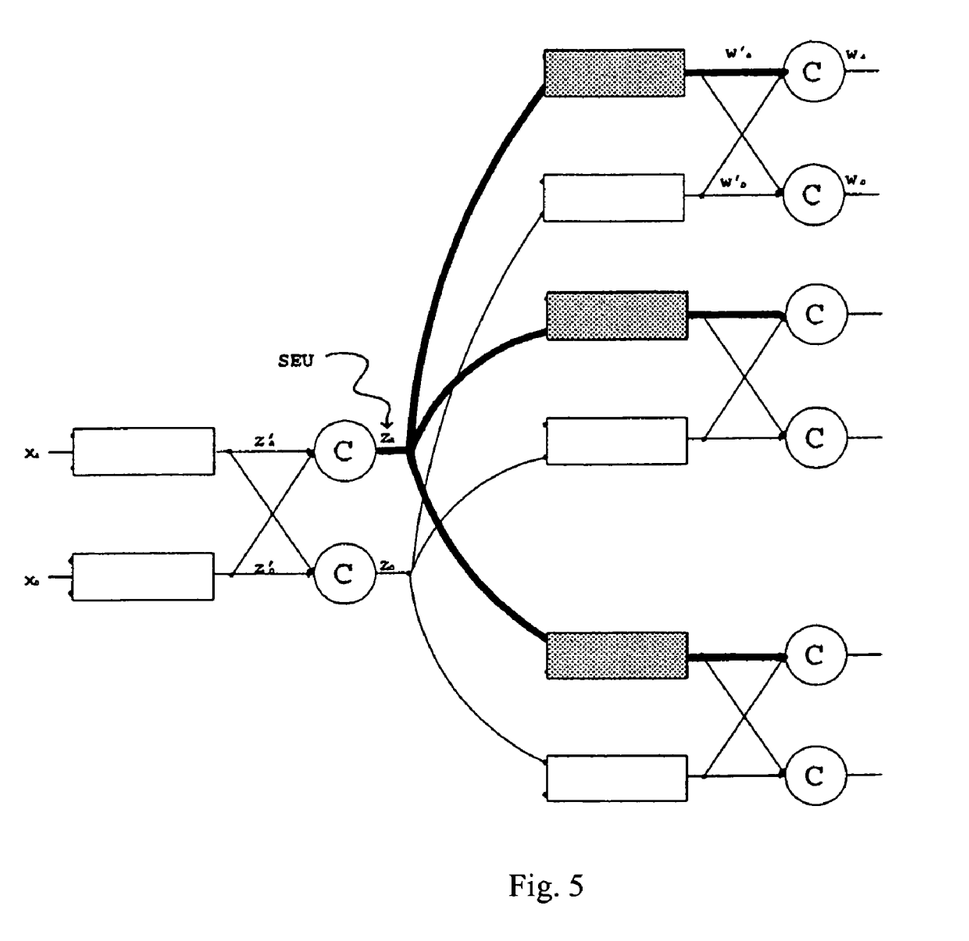
FIG. 5 is a diagram illustrating gates, shown with gray shading, that have fired as a result of a soft error, and showing propagation of the error in heavy lines, according to principles of the invention.

Finally, consider a soft error at $z_a$ during s=( . . . $z_a z_b$ . . . )=( . . . 00 . . . ), which is changed into $s_{error}$=( . . . 10 . . . ). Some of the subsequent gates may fire because of $s_{error}$. FIG. 5 is a diagram illustrating gates, shown with gray shading, that have fired as a result of a soft error, and showing propagation of the error in heavy lines. While this can affect the subsequent CI variables (such as $w'_a$), the corrupted values do not propagate past the double-checking C-elements, and one variable in each duplicated set remains correct. The difference relative to the previous cases is that the input $z_a$ can cause corruption of $w'_a$ the output of the next gate. So if there are no double-checking C-elements from $w_a$, $w_b$ to $x_a$, $x_b$ in a feedback cycle, the state ( . . . $w_a$ $w_b$ . . . )=( . . . 10 . . . ) or ( . . . 01 . . . ) caused by the soft error may bring about (. . .$z_a z_b$ . . . )=( . . . 10 . . . ) or ( . . . 01 . . . ), which disables double-checking gates for z and keep $z_a$ from restoring and deadlock can happen. We can avoid this deadlock if there are at least three DD gates in each feedback cycle. In the construction, $z_a$ are restored by the double-checking of z, and then $w'_a$ will be corrected.

Multiple-Event Upset

If multiple errors occur among different set of CI and CO variables, and each error occurs in a different DD gate, for example, errors at $x'_a$ and $w_a$, DDPRS still are executed correctly because each error will be restored by its own double-checking C-elements.

Figure 6:
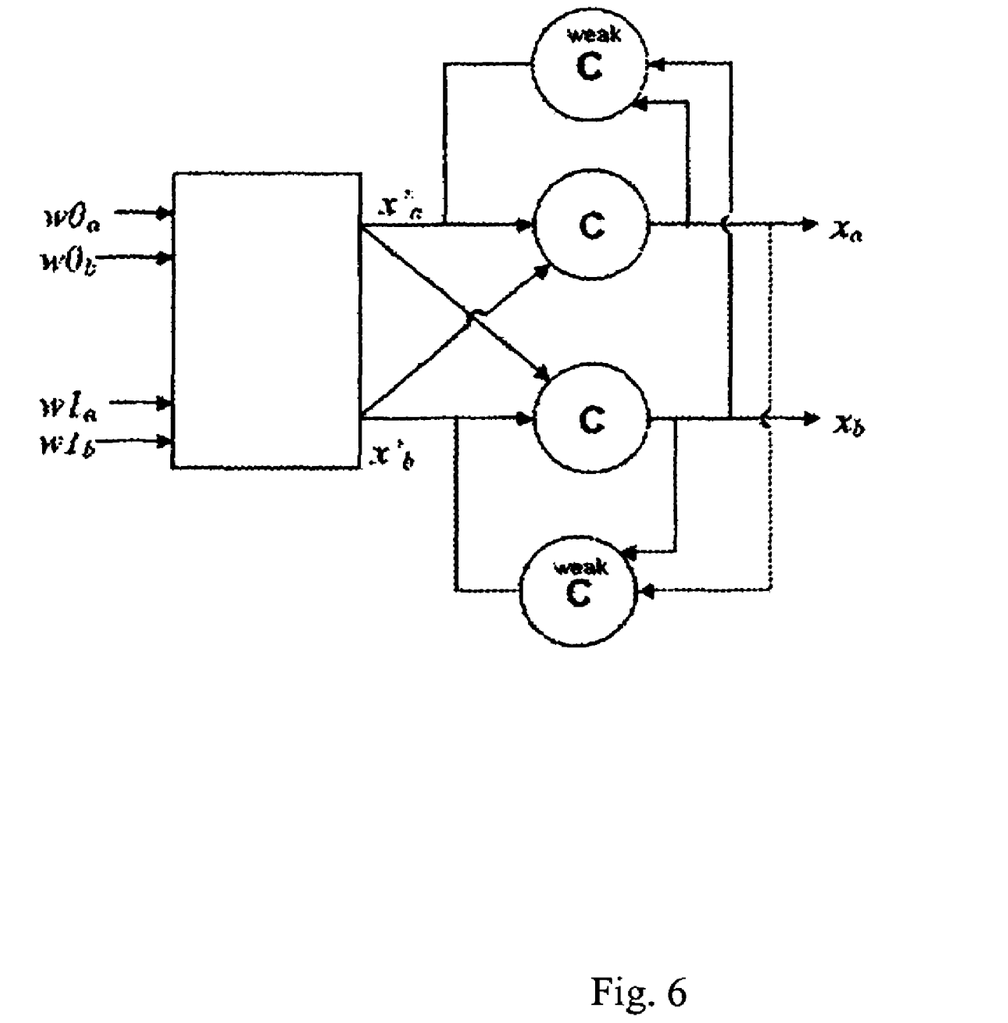
FIG. 6 is a diagram illustrating the use of weak C-elements in a CMOS implementation to handle multiple soft errors, according to principles of the invention.

Generally, the time interval between one soft error and the next soft error in the system is larger than the cycle time of a computation, and a corrupted value will be cleaned up before the next error occurs. However a soft error at CI variable $x'_a$ may keep a corrupted value for a long enough time that it may overlap with another soft error at $x'_b$. Two accumulated soft errors at correlated variables can defeat the tolerance of the DDPRS. In a CMOS implementation, this problem can be avoided by introducing weak C-elements, as shown in FIG. 6. The weak C-elements use $x_a x_b$ to restore corruption on $x'_a$, $x'_b$ when the double-checking C-elements are disabled. This construction can be considered as double-checked staticizers.

Illustrative Embodiment

Figure 7:
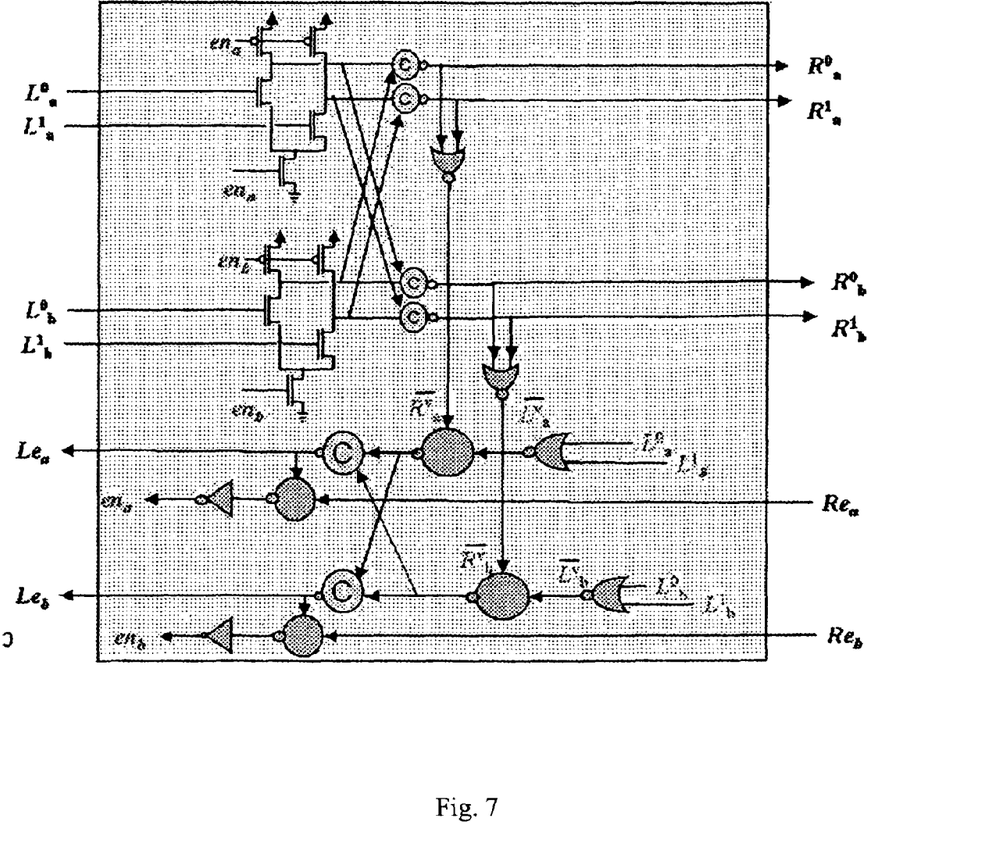
FIG. 7 is a diagram that shows an embodiment of a DD buffer whose inputs and outputs are encoded by duplicated 1-out-of-2 encoding with duplicated acknowledgements, according to principles of the invention.

We can construct soft-error-tolerant QDI systems by applying the DD approach described herein. FIG. 7 is a diagram that shows an embodiment of a DD buffer whose inputs and outputs are encoded by duplicated 1-out-of-2 encoding (e.g, $L^0_a$, $L^0_b$, $L^1_a$, $L^1_b$) with duplicated acknowledgements (e.g., $Le_a$, $Le_b$). The construction of the buffer, called a Pre-Charged Half Buffer (PCHB), is one of several possible implementations of a buffer. Here we compare DDPCHB with PCHB whose inputs and outputs are encoded by 1-out-of-4 coding. The layout was done in the TSMC SCN 0.18-μm CMOS process offered by MOSIS.

Table 1 indicates that the number of nodes in the soft-error-tolerant circuit and the size of the circuit are slightly more than twice that of a conventional PCHB. This is the result of duplicating all of the gates and then attaching double-checking C-elements. As compared to a PCHB, the DDPCHB is slower because there are more transitions in a cycle, and because the DDPCHB uses gates that have more series transistors than gates in the PCHB.

Figure 8:
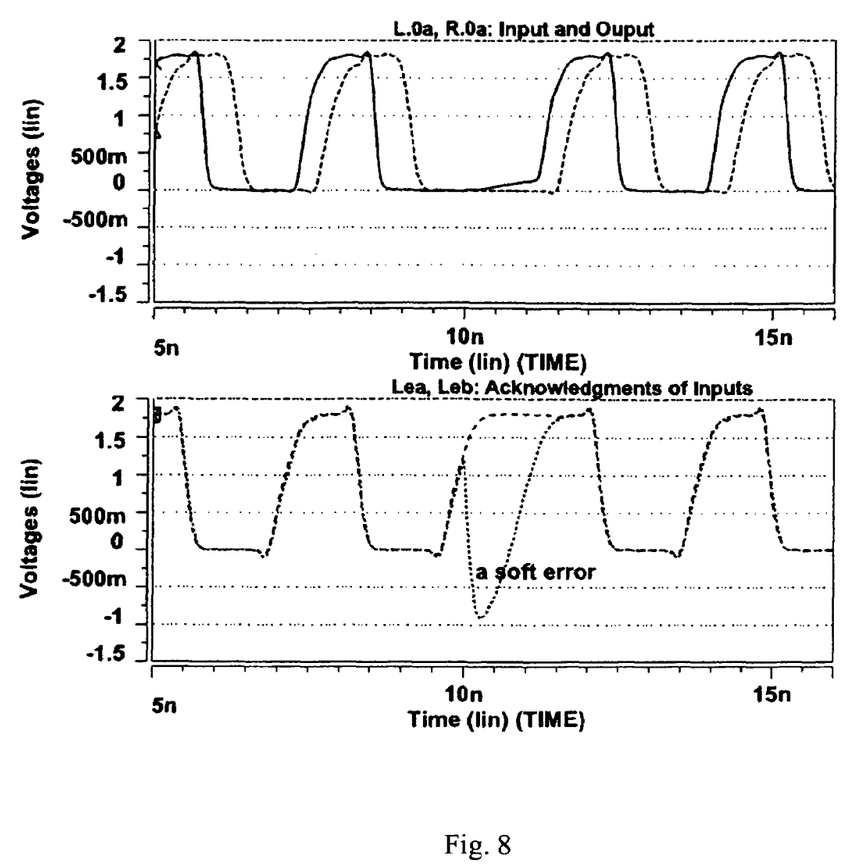
FIG. 8 is a diagram that shows a soft error modeled by a short-duration current pulse in SPICE simulation, according to principles of the invention.

FIG. 8 is a diagram that shows a soft error modeled by a short-duration current pulse in SPICE simulation. We used a pulse with a 10-ps rise time and a 250-ps fall time. The current peak value, 1.5 mA, is chosen to be able to flip the value of a node. In the simulation a bit-flipping at $Le_a$ occurs at 10 ns. As we expect, the doubled-up nodes rise and fall almost simultaneously in normal conditions, and the flipping makes the signal shape of the node $Le_a$ different from that of the node $Le_b$. Even though the value of the $Le_a$ node is flipped, it does not affect the circuit behavior, and only the input signals arrives later than usual. The whole system will be restored to a valid state when the node $Le_a$ has the same value as the node $Le_b$ at 11 ns.

The method of duplicating and double-checking variables provides a useful way of making QDI circuits soft-error-tolerant. Duplicating variables provides the doubled-up stability. Double-checking with C-elements prevents a soft-error effect from propagating to subsequent gates. The stability property permits us to avoid having to provide tripled logic gates: the correct data can be reconstructed before it propagates to the next stage. The performance loss due to duplicating of variables and double-checking C-elements is acceptable.

In another embodiment, one can combine two soft error mitigation schemes. The first soft error mitigation scheme is to duplicate and double-check computation cells, and the other is to interlock coupled inverters of programmable bits. A soft-error tolerant logic cell for QDI FPGAs (Field Programmable Gate Arrays) based on the combination is presented.

FPGAs are becoming more attractive because of recent enhancements of capacity and performance. However, in synchronous FPGAs, there is growing concern regarding clock distribution and increased power consumption. Soft-error tolerant QDI FPGAs are attractive because of their lack of a clock and because they can be power-efficient. Some general QDI FPGA architectures have been proposed.

An illustrative Design for a Soft-Error Tolerant FPGA Cell

FPGA Architecture

Figure 9:
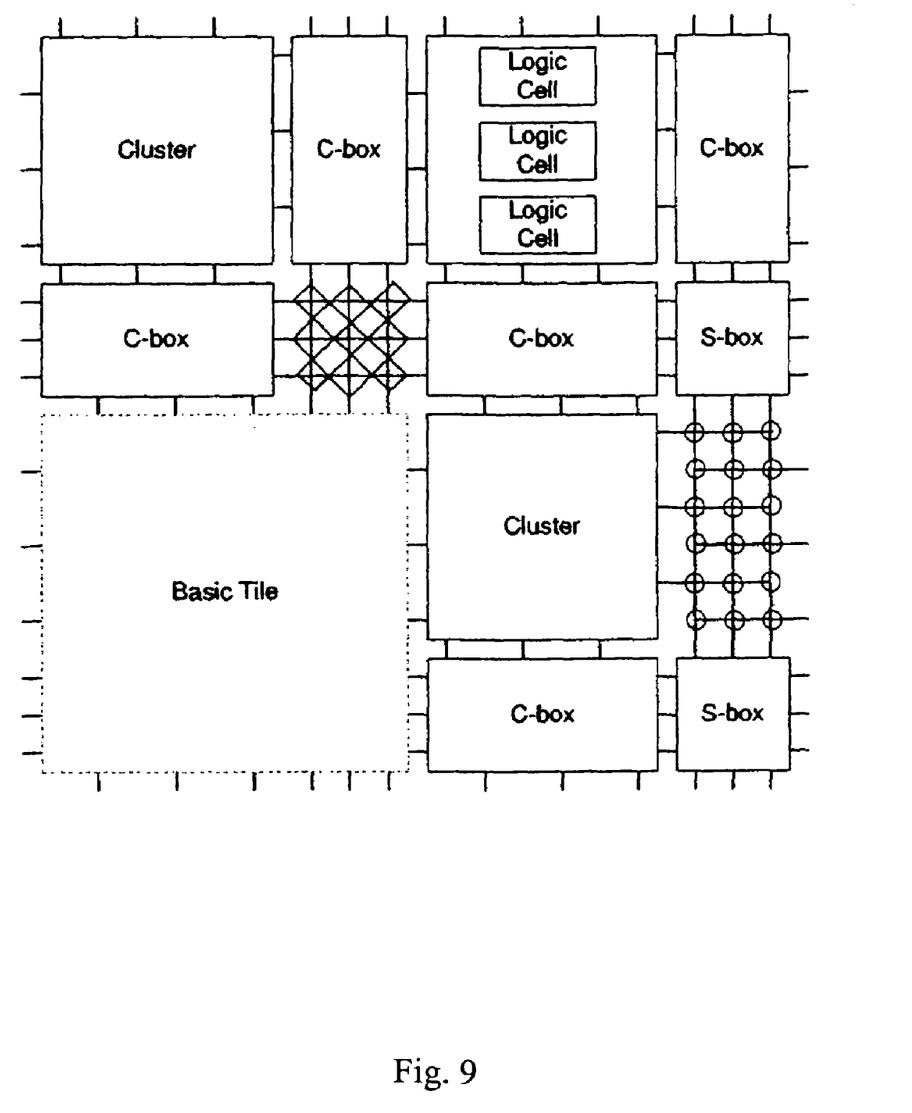
FIG. 9 is a diagram illustrating an embodiment of an FPGA architecture, according to principles of the invention.

FIG. 9 is a diagram illustrating an embodiment of one FPGA architecture. A basic FPGA tile consists of a cluster, two connection boxes (C-box) and a switch box (S-box). A system described in a high-level language is decomposed into implementable logic modules, which correspond to clusters, and whose interconnection information is mapped into C-boxes and S-boxes. C-boxes connect a cluster to interconnect-paths and S-boxes provide switches that switch interconnect-paths. Logic cells in a cluster share inputs and outputs. Each logic cell is a PCHB (Pre-charged Half Buffer), which comprises a pulldown computation stack, and validity trees of inputs and outputs. The cell contains programmable SRAM bits: some of the bits are for configuring computations and the others are for setting patterns of communication between cells.

There are two types of soft errors in FPGAs. An error in computation parts (e.g., pulldown stacks) can temporarily bring about incorrect computations. An error in programmable bits may change system configurations permanently as well as lead to incorrect computations.

Dual Interlocked Programmable Bits

Figure 10A:
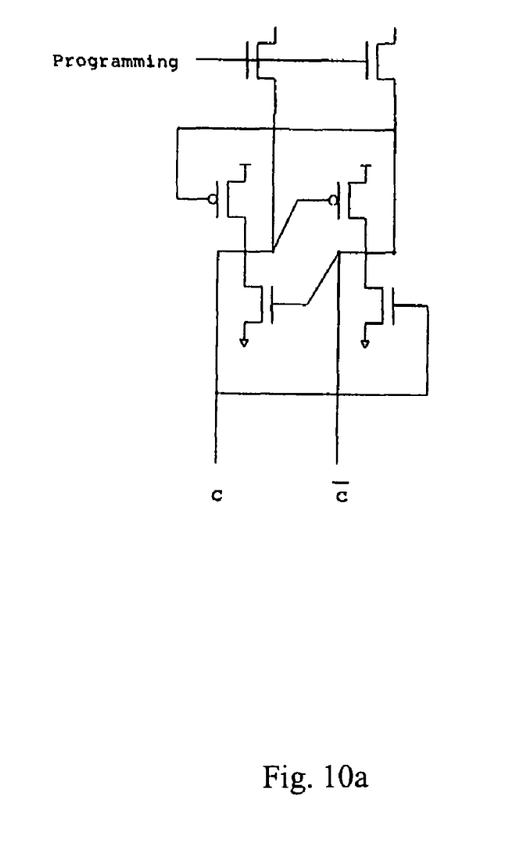

Programmable SRAM bits in FPGA often employ two conventional cross-coupled inverters, which consist of 6 transistors, as shown in FIG. 10a. Although the DD scheme can be adapted to obtain soft-error tolerance of programmable bits, a modification of Calin's dual interlocked (DI) 12-transistor memory cell is more efficient and also suitable to the DD scheme.

Figure 10B:
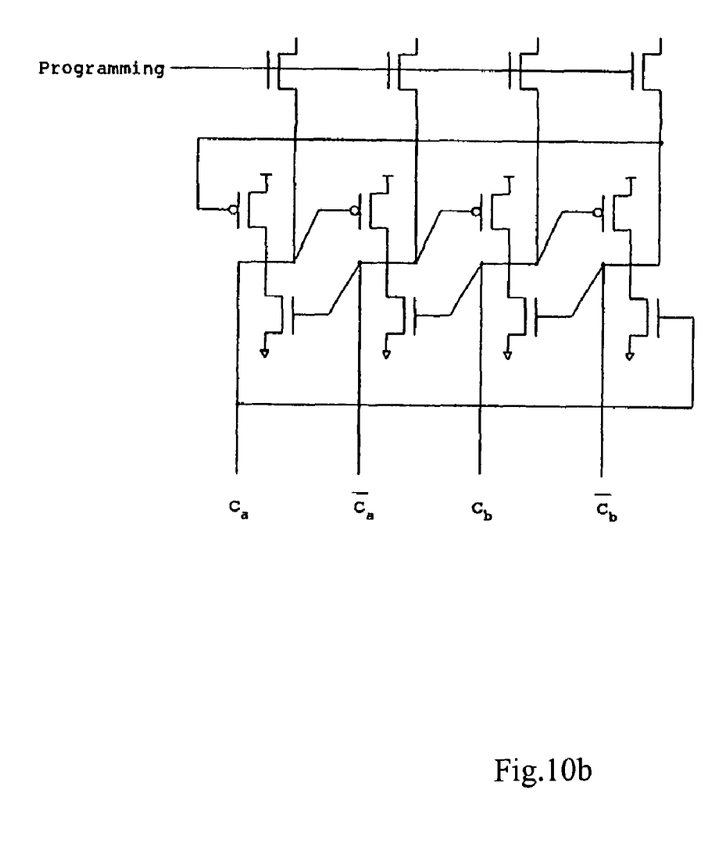
FIG. 10b is a diagram showing an embodiment of a circuit that employs a dual interlocked transistor memory cell to encode a bit as two pairs of complementary values, according to principles of the invention.

FIG. 10b is a diagram that shows an embodiment of a circuit that employs a dual interlocked transistor memory cell to encode a bit as two pairs of complementary values. In this embodiment, four nodes (e.g., ca, c̲a, cb, c̲b) in a DI programmable bit encode a bit as two pairs of complementary values (i.e., 0101, 1010). The logic state of each node is controlled by two complementary adjacent nodes, and one of the adjacent nodes always keeps a correct value to restore corrupt data. For example, an error at ca in the 0101 state causes cb to be an unknown state because both pullup and pulldown transistors are turned on, but ca still holds 1 that is used to restore ca. Other erroneous cases can be similarly analyzed. Each DI memory can tolerate any single error or two errors in pairs of non-adjacent nodes (i.e., {ca,cb}, {c̄a, c̄b}).

Soft-Error Tolerant FPGA Cell

Figure 11:
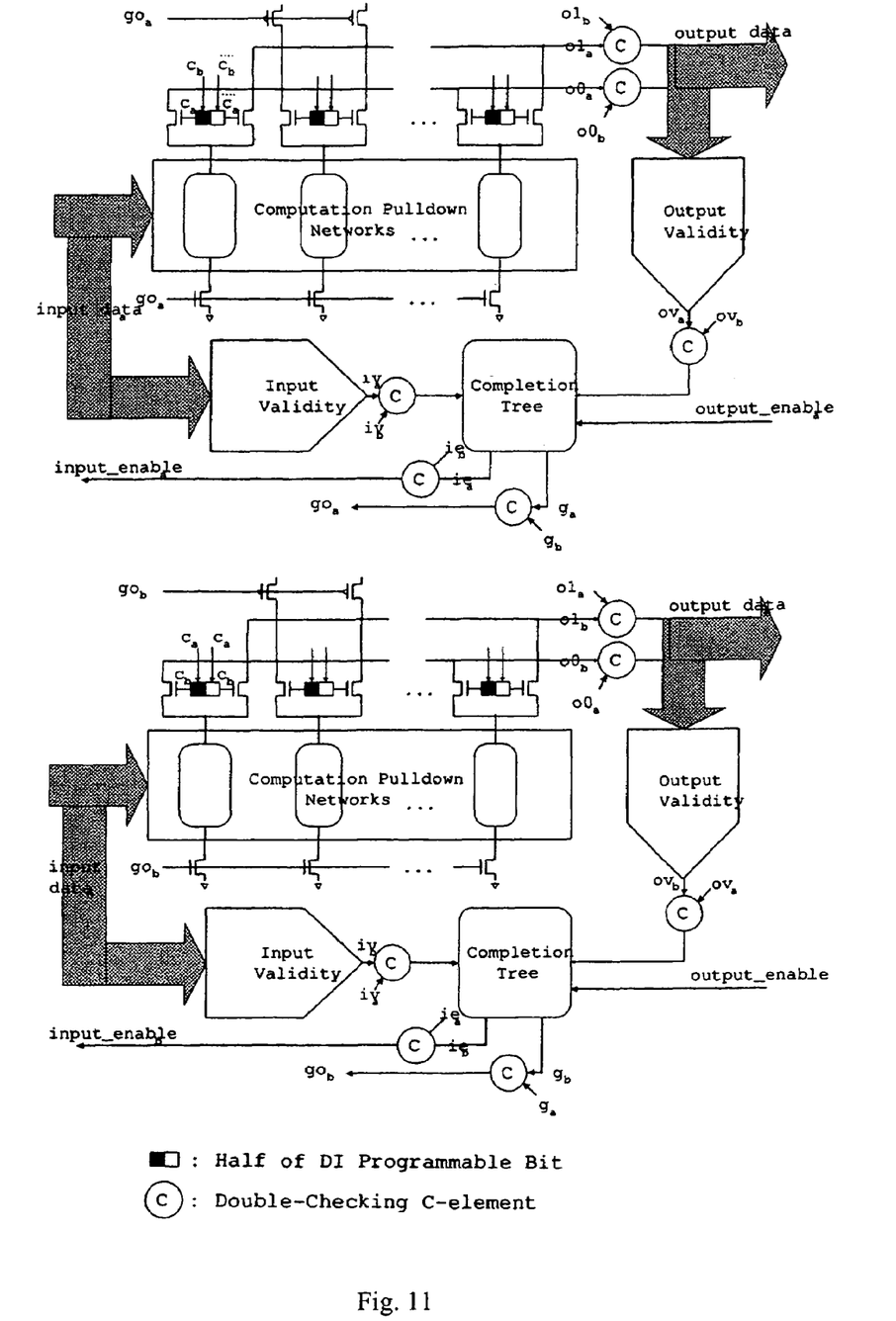
FIG. 11 shows the construction of an embodiment of a soft-error tolerant logic cell, according to principles of the invention.

We can construct a FPGA logic cell based on the DD scheme with DI programmable bits. FIG. 11 shows the construction of an embodiment of a soft-error tolerant logic cell. Two original cells are interweaved by double-checking C-elements. In the same manner, we can construct soft-tolerant S-boxes and C-boxes. The area of the whole FPGA will be enlarged approximately by a factor of two.

When a soft error occurs, a conventional QDI FPGA may perform incorrectly or halt. The method of duplicating and double-checking nodes provides a way of protecting QDI systems from soft errors. The stability property of QDI systems permits us to avoid having to provide triply redundant logic cells. The dual interlocked design is used for programmable bits, and it is more efficient than direct application of the DD scheme to programmable bits. Because the design of soft-error tolerant logic cells is straightforward, we can easily convert existing circuits into soft-error tolerant design and adapt existing synthesis procedures to the duplicated cells.

It is believed that the systems and methods described herein can also be applied to circuits that are clocked (e.g., synchronous), with the proviso that when a C-element identifies that its inputs are not deemed equivalent, that the input to that stage inhibited from changing, and the output of that stage is prevented from propagating to the next stage by the temporary inhibition of the clock driving the circuit from issuing further clock pulses, effectively halting the clocked circuit until such time that the soft error clears. In such circuits, a device such as a latch can be used to hold the value of the signal that is applied to an input terminal of a circuit stage. During the time that the clock is inhibited, the latch has its enable line inhibited, it will not change state, and the value it holds will be maintained.

It is believed that the systems and methods described herein can be applied to asynchronous analog circuits, with the proviso that inputs to stages are passed through a "sample and hold" circuit element prior to being applied to the inputs of a circuit stage. As is well known in the circuit arts, sample and hold circuit elements are used, for example, in the inputs to analog-to-digital converters, so that the analog signal that is going to be converted is a substantially constant signal during the time required to perform the conversion to a digital value. A simple sample and hold circuit is a capacitor that is charged to a voltage representing the analog signal value, and which is then disconnected from the analog signal during the time when the conversion is performed.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A method of mitigating soft errors in an asynchronous digital circuit having a stage comprising duplicate asynchronous circuit elements, each of said duplicate asynchronous digital circuit elements having at least one input terminal and at least one output terminal, each of said duplicate asynchronous digital circuit elements providing the same logic operation, comprising the steps of:
   (a) asserting a digital signal at corresponding ones of each of said at least one input terminals of said duplicate asynchronous digital circuit elements;
   (b) inhibiting a variation of said asserted digital signal asserted at corresponding ones of each of said at least one input terminals of said duplicate asynchronous digital circuit elements;
   (c) comparing an output signal appearing at said at least one output terminal of one of said duplicate asynchronous digital circuit elements with a corresponding output signal appearing at said at least one output terminal of the other of said duplicate asynchronous digital circuit elements; and
   based on the result of the comparison of the output signals:
   (d) if said output signals are not deemed equivalent:
     (1) inhibiting a resultant signal from being provided as output from the stage;
     (2) maintaining the step of inhibiting a variation of said asserted digital signal asserted at corresponding ones of each of said at least one input terminals of said duplicate asynchronous digital circuit elements;
     (3) continuing to compare an output signal appearing at said at least one output terminal of one of said duplicate asynchronous digital circuit elements with a corresponding output signal appearing at said at least one output terminal of the other of said duplicate asynchronous digital circuit elements; and
     (4) continuing steps (d)(1), (d)(2) and (d)(3) until said output signals are deemed equivalent; and
   (e) if said output signals are deemed equivalent:
     (1) providing at least one resultant signal as output from the stage; and
     (2) permitting a variation of the asserted digital signal asserted at corresponding ones of each of said at least one input terminals of said duplicate asynchronous digital circuit elements;
   whereby the stage comprising duplicate asynchronous digital circuit elements is active in the absence of soft errors and is prevented from being active during the presence of soft errors, thereby eliminating soft errors from propagating in the asynchronous digital circuit.

2. The method of mitigating soft errors in an asynchronous digital circuit having a stage comprising duplicate asynchronous circuit elements of claim 1, wherein said method employs three or more stages comprising duplicate asynchronous circuit elements.

3. The method of mitigating soft errors in an asynchronous digital circuit having a stage comprising duplicate asynchronous circuit elements of claim 1, wherein the step of comparing an output signal appearing at said at least one output terminal of one of said duplicate asynchronous digital circuit elements with a corresponding output signal appearing at said at least one output terminal of the other of said duplicate asynchronous digital circuit elements is performed by a c-element.

4. The method of mitigating soft errors in an asynchronous digital circuit having a stage comprising duplicate asynchronous circuit elements of claim 1, wherein the step of inhibiting a variation of said asserted digital signal asserted at corresponding ones of each of said at least one input terminals of said duplicate asynchronous digital circuit elements is performed by a c-element.

5. The method of mitigating soft errors in an asynchronous digital circuit having a stage comprising duplicate asynchronous circuit elements of claim 1, wherein the step of inhibiting a resultant signal from being provided as output from the stage is performed by a c-element.

6. The method of mitigating soft errors in an asynchronous digital circuit having a stage comprising duplicate asynchronous circuit elements of claim 1, wherein said method corrects a plurality of soft errors using a weak c-element.

7. An asynchronous digital circuit configured to mitigate soft error propagation, comprising:
 a stage comprising duplicate asynchronous circuit elements, each of said duplicate asynchronous digital circuit elements having at least one input terminal and at least one output terminal, each of said duplicate asynchronous digital circuit elements providing the same logic operation;
 a first comparison element having two input terminals and a first output, a selected one of said two input terminals connected to each of said at least one output terminal of each of said duplicate asynchronous digital circuit elements, and a second comparison element having two input terminals and a second output, a selected one of said two input terminals connected to each of said at least one output terminal of each of said duplicate asynchronous digital circuit elements; and
 a control element in electrical communication with said first output of said first comparison element and said second output of said second comparison element, said control element configured to provide control signals based on the equivalence or lack of equivalence of signals appearing at said first output of said first comparison element and said second output of said second comparison element:
  in the event that the signals appearing at said first and second outputs are not equivalent:
   said control element provides a control signal to inhibit a resultant signal from appearing as output at an output terminal of the stage; and
   said control element provides a control signal to inhibit a variation of said asserted digital signal asserted at corresponding ones of each of said at least one input terminals of said duplicate asynchronous digital circuit elements; and
  in the event that the signals appearing at said first and second outputs are equivalent:
   said control element provides a control signal to allow at least one resultant signal as output at said output terminal the stage; and
   said control element provides a control signal to permit a variation of the asserted digital signal asserted at corresponding ones of each of said at least one input terminals of said duplicate asynchronous digital circuit elements;
 so that the stage comprising duplicate asynchronous digital circuit elements is active to provide a signal representing said logic operation in the absence of soft errors and is prevented from being active during the presence of soft errors, thereby eliminating soft errors from propagating in the asynchronous digital circuit.

8. The asynchronous digital circuit configured to mitigate soft error propagation of claim 7, wherein said asynchronous digital circuit comprises three or more stages comprising duplicate asynchronous circuit elements.

9. The asynchronous digital circuit configured to mitigate soft error propagation of claim 7, wherein said first comparison element is a c-element.

10. The asynchronous digital circuit configured to mitigate soft error propagation of claim 7, wherein said control element is combined with said comparison element.

11. The asynchronous digital circuit configured to mitigate soft error propagation of claim 7, wherein said circuit is a field programmable gate array.

12. The asynchronous digital circuit configured to mitigate soft error propagation of claim 7, wherein said circuit comprises dual interlocked programmable bits.

13. The asynchronous digital circuit configured to mitigate soft error propagation of claim 7, wherein said circuit comprises a pre-charged half buffer.

14. The asynchronous digital circuit configured to mitigate soft error propagation of claim 7, wherein said circuit comprises a weak c-element.

* * * * *